United States Patent
Das et al.

(10) Patent No.: US 7,541,265 B2
(45) Date of Patent: Jun. 2, 2009

(54) CAPACITOR MATERIAL FOR USE IN CIRCUITIZED SUBSTRATES, CIRCUITIZED SUBSTRATE UTILIZING SAME, METHOD OF MAKING SAID CIRCUITIZED SUBSTRATE, AND INFORMATION HANDLING SYSTEM UTILIZING SAID CIRCUITIZED SUBSTRATE

(75) Inventors: Rabindra N. Das, Vestal, NY (US);
John M. Lauffer, Waverly, NY (US);
Kostas I. Papathomas, Endicott, NY (US); Mark D. Poliks, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 55 days.

(21) Appl. No.: 11/031,085

(22) Filed: Jan. 10, 2005

(65) Prior Publication Data

US 2006/0151863 A1    Jul. 13, 2006

(51) Int. Cl.
*H01L 21/425* (2006.01)
(52) U.S. Cl. .................................. 438/528; 257/532
(58) Field of Classification Search ............... 257/295, 257/296, 310, 532; 438/528, 957
See application file for complete search history.

(56) References Cited

U.S. PATENT DOCUMENTS

| 5,016,085 | A |  | 5/1991 | Hubbard et al. |
| 5,026,624 | A |  | 6/1991 | Day et al. |
| 5,079,069 | A |  | 1/1992 | Howard et al. |
| 5,099,309 | A |  | 3/1992 | Kryzaniwsky |
| 5,162,977 | A | * | 11/1992 | Paurus et al. ............. 361/762 |
| 5,280,192 | A |  | 1/1994 | Kryzaniwsky |
| 5,300,402 | A |  | 4/1994 | Card, Jr. et al. |
| 5,426,263 | A |  | 6/1995 | Potter et al. |
| 5,449,948 | A | * | 9/1995 | Inoue et al. ............... 257/531 |
| 5,801,108 | A | * | 9/1998 | Huang et al. ............... 501/32 |
| 5,831,833 | A |  | 11/1998 | Shirakawa et al. |
| 6,068,782 | A |  | 5/2000 | Brandt et al. |
| 6,084,306 | A |  | 7/2000 | Yew et al. |

(Continued)

OTHER PUBLICATIONS

Perfecto, Eric et. al, "Evaluation of Cu Capping Alternatives for Polyimide-Cu MCM-D", 0-7803-7038-4/01, IEEE, 2001 Electronic Components and Technology Conference, 2001.*

(Continued)

*Primary Examiner*—Thao X Le
*Assistant Examiner*—Ajay K. Arora
(74) *Attorney, Agent, or Firm*—Mark Levy; Lawrence R. Fraley; Hinman, Howard & Kattell (57) ABSTRACT

A material for use as part of an internal capacitor within a circuitized substrate includes a polymer (e.g., a cycloaliphatic epoxy or phenoxy based) resin and a quantity of nano-powders of ferroelectric ceramic material (e.g., barium titanate) having a particle size substantially in the range of from about 0.01 microns to about 0.90 microns and a surface area for selected ones of said particles within the range of from about 2.0 to about 20 square meters per gram. A circuitized substrate adapted for using such a material and capacitor therein and a method of making such a substrate are also provided. An electrical assembly (substrate and at least one electrical component) and an information handling system (e.g., personal computer) are also provided.

16 Claims, 4 Drawing Sheets

U.S. PATENT DOCUMENTS

| | | | |
|---|---|---|---|
| 6,150,456 | A | 11/2000 | Lee et al. |
| 6,207,595 | B1 | 3/2001 | Appelt et al. |
| 6,242,282 | B1 | 6/2001 | Fillion et al. |
| 6,288,905 | B1 * | 9/2001 | Chung ........................ 361/771 |
| 6,370,012 | B1 | 4/2002 | Adae-Amoakoh et al. |
| 6,395,996 | B1 | 5/2002 | Tsai et al. |
| 6,446,317 | B1 | 9/2002 | Figueroa et al. |
| 6,524,352 | B2 | 2/2003 | Adae-Amoakoh et al. |
| 6,544,651 | B2 * | 4/2003 | Wong et al. ................. 428/413 |
| 6,577,492 | B2 | 6/2003 | O'Bryan, Jr. |
| 6,616,794 | B2 * | 9/2003 | Hartman et al. .......... 156/306.9 |
| 6,699,780 | B1 * | 3/2004 | Chiang et al. ............... 438/612 |
| 6,704,207 | B2 | 3/2004 | Kopf |
| 6,847,527 | B2 * | 1/2005 | Sylvester et al. ............ 361/763 |
| 6,967,138 | B2 * | 11/2005 | Ding .......................... 438/253 |
| 2002/0177271 | A1 * | 11/2002 | Lee et al. ..................... 438/239 |

OTHER PUBLICATIONS

"A New, Thin High-Performance Organic Substrate", by Donald Banks, Robin Gorrell, Duy Le-Huu, David Hanson and Shichun Qu. Presented Jun. 23, 2004 at the Topical Workshop & Exhibition on Flip Chip Technology. (Sponsor—International Microelectronics and Packaging Society), Austin, Texas.

* cited by examiner

CAPACITOR MATERIAL FOR USE IN CIRCUITIZED SUBSTRATES, CIRCUITIZED SUBSTRATE UTILIZING SAME, METHOD OF MAKING SAID CIRCUITIZED SUBSTRATE, AND INFORMATION HANDLING SYSTEM UTILIZING SAID CIRCUITIZED SUBSTRATE

TECHNICAL FIELD

The present invention relates to providing capacitors within circuitized substrates such as printed circuit boards, chip carriers and the like, and more specifically to a method for doing so and to products including such internal components as part thereof. Even more particularly, the invention relates to such methodologies and products wherein the capacitors are comprised of nano-powders.

CROSS REFERENCE TO CO-PENDING APPLICATIONS

In Ser. No. 11/031,074, entitled "Capacitor Material With Metal Component For Use In Circuitized Substrates, Circuitized Substrate Utilizing Same, Method Of Making Said Circuitized Substrate, And Information Handling System Utilizing Said Circuitized Substrate", filed Jan. 10, 2005 (inventors: Rabindra Das et al), there is defined a material for use as part of an internal capacitor within a circuitized substrate which includes a polymer resin and a quantity of nano-powders including a mixture of at least one metal component and at least one ferroelectric ceramic component, the ferroelectric ceramic component nano-particles having a particle size substantially in the range of between about 0.01 microns and about 0.9 microns and a surface within the range of from about 2.0 to about 20 square meters per gram. A circuitized substrate adapted for using such a material and capacitor therein and a method of making such a substrate are also provided. An electrical assembly (substrate and at least one electrical component) and an information handling system (e.g., personal computer) are also provided. Ser. No. 11/031,074 is assigned to the same Assignee as the present invention and is now U.S. Pat. No. 7,025,607. A divisional application of Ser. No. 11/031,074 was filed Jan. 4, 2006, and is now Ser. No. 11/324,273.

In Ser. No. 10/900,385, entitled "Circuitized Substrate With Internal Organic Memory Device, Method Of Making Same, Electrical Assembly Utilizing Same, and Information Handling System Utilizing Same" and filed Jul. 28, 2004 (inventors: S. Desai et al), there is defined a circuitized substrate comprised of at least one layer of dielectric material having an electrically conductive pattern thereon. At least part of the pattern is used as the first layer of an organic memory device which further includes at least a second dielectric layer over the pattern and a second pattern aligned with respect to the lower part for achieving several points of contact to thus form the device. The substrate is preferably combined with other dielectric-circuit layered assemblies to form a multilayered substrate on which can be positioned discrete electronic components (e.g., a logic chip) coupled to the internal memory device to work in combination therewith. An electrical assembly capable of using the substrate is also provided, as is an information handling system adapted for using one or more such electrical assemblies as part thereof. This application is assigned to the same assignee of the present invention.

In Ser. No. 10/900,386, entitled "Electrical Assembly With Internal Memory, Circuitized Substrate Having Electrical Components Positioned Thereon, Method Of Making Same, And Information Handling System Utilizing Same" and filed Jul. 28, 2004 (inventors: F. Egitto et al), there is defined an electrical assembly which includes a circuitized substrate comprised of an organic dielectric material having a first electrically conductive pattern thereon. At least part of the dielectric layer and pattern form the first, base portion of an organic memory device, the remaining portion being a second, polymer layer formed over the part of the pattern and a second conductive circuit formed on the polymer layer. A second dielectric layer if formed over the second conductive circuit and first circuit pattern to enclose the organic memory device. The device is electrically coupled to a first electrical component through the second dielectric layer and this first electrical component is electrically coupled to a second electrical component. A method of making the electrical assembly is also provided, as is an information handling system adapted for using one or more such electrical assemblies as part thereof. This application is also assigned to the same assignee as the present invention.

BACKGROUND OF THE INVENTION

Circuitized substrates such as printed circuit boards (hereinafter also referred to as PCBs), chip carriers, and the like typically are constructed in laminate form in which several layers of dielectric material and conductive material (laminates) are bonded together using relatively high temperature and pressure lamination processes. The conductive layers, typically of thin copper, are usually used in the formed substrate for providing electrical connections to and among various devices located on the surface of the substrate, examples of such devices being integrated circuits (semiconductor chips) and discrete passive devices, such as capacitors, resistors, inductors, and the like. The discrete passive devices occupy a high percentage of the surface area of the completed substrate, which is undesirable from a future design aspect because of the increased need and demand for miniaturization in today's substrates and products containing same art. In order to increase the available substrate surface area (also often referred to as "real estate"), there have been a variety of efforts to include multiple functions (e.g. resistors, capacitors and the like) on a single component for mounting on a board. When passive devices are in such a configuration, these are often referred to collectively and individually as integral passive devices or the like, meaning that the functions are integrated into the singular component. Because of such external positioning, these components still utilize, albeit less than if in singular form, board real estate. In response, there have also been efforts to embed discrete passive components within the board, such components often also referred to as embedded passive components. A capacitor designed for disposition within (between selected layers) a PCB (board) substrate may thus be referred to as an embedded integral passive component, or, more simply, an embedded capacitor. Such a capacitor thus provides internal capacitance. The result of this internal positioning is that it is unnecessary to also position such devices externally on the PCB's outer surface(s), thus saving valuable PCB real estate.

For a fixed capacitor area, two known approaches are available for increasing the planar capacitance (capacitance/area) of an internal capacitor. In one such approach, higher dielectric constant materials can be used, while in a second, the thickness of the dielectric can be reduced. These constraints are reflected in the following formula, known in the art, for capacitance per area:

$$C/A = (\text{Dielectric Constant of Laminate} \times \text{Dielectric Constant in Vacuum}/\text{Dielectric Thickness})$$

where: C is the capacitance and A is the capacitor's area. Some of the patents listed below, particularly U.S. Pat. No. 5,162,977, mention use of various materials for providing desired capacitance levels under this formula, and many mention or suggest problems associated with the methods and resulting materials used to do so.

As stated, there have been past attempts to provide internal capacitance and other internal conductive structures, components or devices (one good example being internal semiconductor chips) within circuitized substrates (PCBs), some of these including the use of nano-powders. The following are some examples of such attempts, including those using nano-powders and those using alternative measures.

In U.S. Pat. No. 6,704,207, entitled "Device and Method for Interstitial Components in a Printed Circuit Board", issued Mar. 9, 2004, there is described a printed circuit board (PCB) which includes a first layer having first and second surfaces, with an above-board device (e.g., an ASIC chip) mounted thereon. The PCB includes a second layer having third and fourth surfaces. One of the surfaces can include a recessed portion for securely holding an interstitial component. A "via", electrically connecting the PCB layers, is also coupled to a lead of the interstitial component. The described interstitial components include components such as diodes, transistors, resistors, capacitors, thermocouples, and the like. In what appears to be the preferred embodiment, the interstitial component is a resistor having a similar size to a "0402" resistor (manufactured by Rohm Co.), which has a thickness of about 0.014 inches.

In U.S. Pat. No. 6,616,794, entitled "Integral Capacitance For Printed Circuit Board Using Dielectric Nanopowders" and issued Sep. 9, 2003, there is described a method for producing integral capacitance components for inclusion within printed circuit boards in which hydro-thermally prepared nano-powders permit the fabrication of dielectric layers that offer increased dielectric constants and are readily penetrated by micro-vias. In the method described in this patent, a slurry or suspension of a hydro-thermally prepared nano-powder and solvent is prepared. A suitable bonding material, such as a polymer, is mixed with the nano-powder slurry, to generate a composite mixture which is formed into a dielectric layer. The dielectric layer may be placed upon a conductive layer prior to curing, or conductive layers may be applied upon a cured dielectric layer, either by lamination or metallization processes, such as vapor deposition or sputtering.

In U.S. Pat. No. 6,544,651, entitled "High Dielectric Constant Nano-Structure Polymer-Ceramic Composite" and issued Apr. 3, 2003, there is described a polymer-ceramic composite having high dielectric constants formed using polymers containing a metal acetylacetonate (acacs) curing catalyst. In particular, a certain percentage of Co(III) may increase the dielectric constant of a certain epoxy. The high dielectric polymers are combined with fillers, preferably ceramic fillers, to form two phase composites having high dielectric constants. Composites having about 30 to about 90% volume ceramic loading and a high dielectric base polymer, preferably epoxy, were apparently found to have dielectric constants greater than about 60. Composites having dielectric constants greater than about 74 to about 150 are also mentioned in this patent. Also mentioned are embedded capacitors with capacitance densities of at least 25 nF/cm$^2$, preferably at least 35 nF/cm$^2$, most preferably 50 nF/cm$^2$.

In U.S. Pat. No. 6,524,352, entitled "Method Of Making A Parallel Capacitor Laminate" and issued Feb. 25, 2003, there is defined a parallel capacitor structure capable of forming an internal part of a larger circuit board or the like structure to provide capacitance therefore. Alternatively, the capacitor may be used as an interconnector to interconnect two different electronic components (e.g., chip carriers, circuit boards, and even semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,446,317, entitled "Hybrid Capacitor And Method Of Fabrication Therefor", and issued Sep. 10, 2002, there is described a hybrid capacitor associated with an integrated circuit package that provides multiple levels of excess, off-chip capacitance to die loads. The hybrid capacitor includes a low inductance, parallel plate capacitor which is embedded within the package and electrically connected to a second source of off-chip capacitance. The parallel plate capacitor is disposed underneath a die, and includes a top conductive layer, a bottom conductive layer, and a thin dielectric layer that electrically isolates the top and bottom layers. The second source of off-chip capacitance is a set of self-aligned via capacitors, and/or one or more discrete capacitors, and/or an additional parallel plate capacitor. Each of the self-aligned via capacitors is embedded within the package, and has an inner conductor and an outer conductor. The inner conductor is electrically connected to either the top or bottom conductive layer, and the outer conductor is electrically connected to the other conductive layer. The discrete capacitors are electrically connected to contacts from the conductive layers to the surface of the package. During operation, one of the conductive layers of the low inductance parallel plate capacitor provides a ground plane, while the other conductive layer provides a power plane.

In U.S. Pat. No. 6,395,996, entitled "Multi-layered Substrate With Built-In Capacitor Design" and issued May 28, 2002, there is described a multi-layered substrate having built-in capacitors which are used to decouple high frequency noise generated by voltage fluctuations between a power plane and a ground plane of a multi-layered substrate. At least one kind of dielectric material, which has filled-in through holes between the power plane and the ground plane and includes a high dielectric constant, is used to form the built-in capacitors.

In U.S. Pat. No. 6,370,012, entitled "Capacitor Laminate For Use In A Printed Circuit Board And As An Inter-connector" and issued Apr. 9, 2002, there is described a parallel capacitor structure capable of forming an internal part of a larger circuit board or the like structure to provide capacitance there-for. Alternatively, the capacitor may be used as an inter-connector to interconnect two different electronic components (e.g., chip carriers, circuit boards, and even semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,242,282, entitled "Circuit Chip Package and Fabrication Method", issued Jun. 5, 2001, there is described a method for packaging a chip which includes the steps of providing an interconnect layer including insulative material having a first side and a second side, initial metallization patterned on second side metallized portions of the second side and not on second side non-metallized portions of the second side, a substrate via extending from the first side to one of the second side metallized portions, and a chip via extending from the first side to the second side non-metallized portion. The method also includes positioning a chip on the second side with a chip pad of the chip being aligned with the chip via, and patterning connection metallization on selected portions of the first side of the interconnect layer and in the via so as to extend to the second side metallized portion and to the chip pad. About the chip is molded a "substrate" or other dielectric material.

In U.S. Pat. No. 6,207,595, entitled "Laminate and Method of Manufacture Thereof", issued Mar. 27, 2001, there is described a fabric-resin dielectric material for use in a laminate structure and method of its manufacture. The resulting structure is adaptable for use in a printed circuit board or chip carrier substrate. The resin may be an epoxy resin such as is currently used on a large scale worldwide for "FR-4" composites. A resin material based on bismaleimide-triazine (BT) is also acceptable, this patent further adding that, more preferably, the resin is a phenolically hardenable resin material as is known in the art, with a glass transition temperature of about 145 degrees Celsius (C.).

In U.S. Pat. No. 6,150,456, entitled "High Dielectric Constant Flexible Polyimide Film And Process Of Preparations, issued Nov. 21, 2000, there is described a flexible, high dielectric constant polyimide film composed of either a single layer of an adhesive thermoplastic polyimide film or a multilayer polyimide film having adhesive thermoplastic polyimide film layers bonded to one or both sides of the film and having dispersed in at least one of the polyimide layers from 4 to 85 weight % of a ferroelectric ceramic filler, such as barium titanate or polyimide-coated barium titanate, and having a dielectric constant of from 4 to 60. The high dielectric constant polyimide film can be used in electronic circuitry and electronic components such as multilayer printed circuits, flexible circuits, semiconductor packaging and buried (internal) film capacitors.

In U.S. Pat. No. 6,084,306, entitled "Bridging Method of Interconnects for Integrated Circuit Packages", issued Jul. 4, 2000, there is described an integrated circuit package having first and second layers, a plurality of routing pads being integral with the first layer, a plurality of upper and lower conduits, respectively, disposed on the upper and lower surfaces of the first layer, one of the upper conduits electrically connected to one of the lower conduits, a plurality of pads disposed on the second layer, vias that electrically connect the pads to the lower conduits and a chip adhered to the second layer having bonding pads, at least one of which is electrically connected to one of the routing pads.

In U.S. Pat. No. 6,068,782, entitled "Individual Embedded Capacitors For Laminated Printed Circuit Boards" and issued May 30, 2000, there is described a method of fabricating individual, embedded capacitors in multilayer printed circuit boards. The method is allegedly compatible of being performed using standard printed circuit board fabrication techniques. The capacitor fabrication is based on a sequential build-up technology employing a first pattern-able insulator. After patterning of the insulator, pattern grooves are filled with a high dielectric constant material, typically a polymer/ceramic composite. Capacitance values are defined by the pattern size, thickness and dielectric constant of the composite. Capacitor electrodes and other electrical circuitry can be created either by etching laminated copper, by metal evaporation or by depositing conductive ink.

In U.S. Pat. No. 5,831,833, entitled "Bare Chip Mounting Printed Circuit Board and a Method of Manufacturing Thereof by Photo-etching", issued Nov. 3, 1998, there is described a method of manufacturing a "bare chip" multilayer printed circuit board in which arbitrary numbers of wiring circuit conductor layers and insulating layers are alternately stacked on one or both surfaces of a printed circuit board as a substrate, and a recessed portion with an upper opening capable of mounting and resin-encapsulating a bare chip part is formed on the surface of the printed circuit board. In what appears to be the preferred embodiment, one of the insulating layers is made from a photosensitive resin, and the bare chip part mounting recessed portion is formed by photo-etching the insulating layer made from the photosensitive resin.

In U.S. Pat. No. 5,426,263, entitled "Electronic Assembly Having a Double-sided Leadless Component", issued Jun. 20, 1995, there is described an electronic assembly which has a double-sided leadless component and two printed circuit boards. The component has a plurality of electrical terminations or pads on both opposing major surfaces. Each of the printed circuit boards has a printed circuit pattern that has a plurality of pads that correspond to the electrical terminations on both sides of the double-sided leadless component. The electrical terminals on one side of the component are attached to the pads on the first board and the electrical terminals on the other side of the leadless component are attached to the pads on the second board. The printed circuit boards are joined together to form a multilayered circuit board so that the double-sided leadless component is buried or recessed inside. The component is attached to the pads of the printed circuit board using solder.

In U.S. Pat. No. 5,280,192, entitled "Three-dimensional Memory Card Structure With Internal Direct Chip Attachment", issued Jan. 18, 1994, there is described a card structure which includes an internal three dimensional array of implanted semiconductor chips. The card structure includes a power core and a plurality of chip cores. Each chip core is joined to the power core on opposite surfaces of the power core, and each chip core includes a compensator core having a two dimensional array of chip wells. Each chip well allows for a respective one of the semiconductor chips to be implanted therein. Further, a compliant dielectric material is disposed on the major surfaces of the compensator core except at the bottoms of the chip wells. The compliant dielectric material has a low dielectric constant and has a thermal coefficient of expansion compatible with those of the semiconductor chips and the compensator core, so that thermal expansion stability with the chips and the compensator core is maintained.

In U.S. Pat. No. 5,162,977, entitled "Printed Circuit Board Having An Integrated Decoupling Capacitive Element" and issued Nov. 10, 1992, there is described a PCB which includes a high capacitance power distribution core, the manufacture of which is compatible with standard printed circuit board assembly technology. The high capacitance core consists of a ground plane and a power plane separated by a planar element having a high dielectric constant. The high dielectric constant material is typically glass fiber impregnated with a bonding material, such as epoxy resin loaded with a ferro-electric ceramic substance having a high dielectric constant. The ferro-electric ceramic substance is typically a nano-powder combined with an epoxy bonding material. According to this patent, the resulting capacitance of the power distribution core is sufficient to totally eliminate the need for decoupling capacitors on a PCB. Use of pre-fired and ground ceramic nano-powders in the dielectric layer poses obstacles for the formation of thru-holes (conductive holes permitting electronic communication between conductive layers of a PCB), however. Pre-fired and ground ceramic nano-powder particles have a typical dimension in the range of 500-20,000 nanometers (nm). Furthermore, the particle distribution in this range is generally rather broad, meaning that there could be a 10,000 nm particle alongside a 500 nm particle. The distribution within the dielectric layer of particles of different size often presents major obstacles to thru-hole formation where the thru-holes are of extremely small diameter, also referred to in the industry as micro-vias due to the presence of the larger particles. Another problem associated with pre-fired ceramic nano-powders is the ability for the dielectric layer to withstand substantial voltage without breakdown occurring across the layer. Typically, capacitance layers within a PCB are expected to hold off at least 300 volts (V) in order to qualify as a reliable component for PCB construction. The presence of the comparatively larger ceramic particles in pre-fired ceramic nano-powders within a capacitance layer prevents extremely thin layers from being used because the boundaries of contiguous large particles provide a path for voltage breakdown. This is even further undesirable because, as indicated by the equation cited above, greater planar capacitance may also be achieved by reducing the thickness of the dielectric layer. The thickness is thus limited by the size of the particles therein.

In U.S. Pat. No. 5,099,309, entitled "Three-dimensional Memory Card Structure With Internal Direct Chip Attachment", issued Mar. 24, 1992, there is described a memory card structure containing an embedded three dimensional array of semiconductor memory chips. The card structure includes at least one memory core and at least one power core which are joined together in an overlapping relationship. Each memory core comprises a copper-invar-copper (CIC) thermal conductor plane having a two dimensional array of chip well locations on each side of the plane. Polytetrafluoroethylene (PTFE) covers the major surfaces of the thermal conductor plane except at the bottoms of the chip wells. Memory chips are placed in the chip wells and are covered by insulating and wiring levels. Each power core comprises at least one CIC electrical conductor plane and PTFE covering the major surfaces of the electrical conductor plane. Provision is made for providing electrical connection pathways and cooling pathways along vertical as well as horizontal planes internal to the card structure.

In U.S. Pat. No. 5,079,069, entitled "Capacitor Laminate For Use In Capacitive Printed Circuit Boards And Methods Of Manufacture" and issued Jan. 7, 1992, there is described a capacitor laminate which allegedly serves to provide a bypass capacitive function for devices mounted on the PCB, the capacitor laminate being formed of conventional conductive and dielectric layers whereby each individual external device is allegedly provided with capacitance by a proportional portion of the capacitor laminate and by borrowed capacitance from other portions of the capacitor laminate, the capacitive function of the capacitor laminate being dependent upon random firing or operation of the devices. That is, the resulting PCB still requires the utilization of external devices thereon, and thus does not afford the PCB external surface area real estate savings mentioned above which are desired and demanded in today's technology.

In U.S. Pat. No. 5,016,085, entitled "Hermetic package for integrated circuit chips, issued May 14, 1991, there is described a hermetic package which has an interior recess for holding a semiconductor chip. The recess is square and set at 45 degrees with respect to the rectangular exterior of the package. The package uses ceramic layers which make up the package's conductive planes with the interior opening stepped to provide connection points. The lowest layer having a chip opening therein may be left out of the assembly to provide a shallower chip opening recess. This of course is not the same as an internally formed capacitance or semiconductor component of the nature described above, but it does mention internal ceramic layers for a specified purpose as part of an internal structure.

The teachings of the above patents and two co-pending applications are incorporated herein by reference.

Generally speaking, with respect to commercially available dielectric powders which have been used in internal conductive structures such as mentioned in some of the above patents, among these being metal titanate-based powders (see, e.g., U.S. Pat. No. 6,150,456), such powders are known to be produced by a high-temperature, solid-state reaction of a mixture of the appropriate stoichiometric amounts of oxides or oxide precursors (e.g., carbonates, hydroxides or nitrates) of barium, calcium, titanium, and the like. In such calcination processes, the reactants are wet-milled to accomplish a desired final mixture. The resulting slurry is dried and fired at elevated temperatures, sometimes as high as 1,300 degrees Celsius (C), to attain the desired solid state reactions. Thereafter, the fired product is milled to produce a powder. Although the pre-fired and ground dielectric formulations produced by solid phase reactions are acceptable for many electrical applications, these suffer from several disadvantages. First, the milling step serves as a source of contaminants, which can adversely affect electrical properties. Second, the milled product consists of irregularly shaped fractured aggregates which are often too large in size and possess a wide particle size distribution, 500-20,000 nm. Consequently, films produced using these powders are limited to thicknesses greater than the size of the largest particle. Thirdly, powder suspensions or composites produced using pre-fired ground ceramic powders must be used immediately after dispersion, due to the high sedimentation rates associated with large particles. The stable crystalline phase of barium titanate for particles greater than 200 nm is tetragonal and, at elevated temperatures, a large increase in dielectric constant occurs due to a phase transition. It is thus clear that methods of making PCBs which rely on the advantageous features of using nano-powders as part of the PCB's internal components or the like, such as those described in selected ones of the above patents, possess various undesirable aspects which are detrimental to providing a PCB with optimal functioning capabilities when it comes to internal capacitance or other electrical operation. This is particularly true when the desired final product attempts to meet today's miniaturization demands, including the utilization of high density patterns of thru-holes therein.

Thus, a need exists for providing embedded capacitance structures within circuitized substrates such as PCBs which can be accomplished in a facile, relatively inexpensive manner and which assures a final product capable of providing desired capacitance levels. Such a need is particularly significant with respect to PCBs having high density internal thru-holes as defined below. A need also exists for a material that can be effectively used as part of a capacitor within one or more such substrates. It is believed that such a material and structures (products, such as electrical assemblies, PCBs, etc.) adapted for using such materials, would constitute significant advancements in the art.

OBJECTS AND SUMMARY OF THE INVENTION

It is, therefore, a primary object of the present invention to enhance the circuitized substrate art by providing a circuitized substrate having the advantageous features taught herein, including a new and unique material that may be used as an internal capacitor material within the substrate.

It is another object of the invention to provide a method of making such a circuitized substrate which can be accomplished in a relatively facile manner and at relatively low costs.

It is still another object of the invention to provide an electrical assembly capable of using such a circuitized substrate and thus benefiting from the several advantageous features thereof.

It is yet another object of the invention to provide an information handling system capable of utilizing a circuitized substrate as part thereof to thus also benefit from the several advantageous features thereof.

It is still another object of the invention to provide a new and unique material that can be used as part of a capacitor within a circuitized substrate.

According to one aspect of the invention, there is provided a material for integral inclusion within a circuitized substrate to function as part of a capacitor within said circuitized substrate, the material comprising a polymer resin and a quantity of nano-powders of ferroelectric ceramic material having a particle size substantially in the range of between about 0.01 microns and about 0.90 and a surface area for selected ones of said particles within the range of from about 2.0 to about 20 square meters per gram.

According to another aspect of the invention, there is provided a method of making a circuitized substrate having a capacitor included therein, the method comprising providing a first dielectric layer, forming a first electrical conductor on the first layer, positioning a quantity of material on the first electrical conductor, the quantity of material including a polymer resin and a quantity of nano-powders of ferroelectric ceramic material having a particle size substantially in the range of between about 0.01 microns and about 0.90 microns and a surface area for selected ones of said particles within the range of from about 2.0 to about 20 square meters per gram, positioning a second electrical conductor substantially on the quantity of material on the first electrical conductor, and providing a second dielectric layer. The second dielectric layer is located adjacent the first dielectric layer and substantially over the second electrical conductor. The first electrical conductor, the quantity of material and the second electrical conductor form the capacitor.

According to yet another aspect of the invention, there is provided a circuitized substrate comprising a first dielectric layer, a first electrical conductor on the first layer, a quantity of material on the first electrical conductor, this quantity of material including a polymer resin and a quantity of nano-powders of ferroelectric ceramic material having a particle size substantially in the range of between about 0.01 microns and about 0.90 microns and a surface area for selected ones of said particles within the range of from about 2.0 to about 20 square meters per gram, a second electrical conductor positioned substantially on the quantity of material, and a second dielectric layer. This second dielectric layer is located adjacent the first dielectric layer and substantially over the second electrical conductor. The first electrical conductor, the quantity of material and the second electrical conductor form the capacitor.

According to still another aspect of the invention, there is provided an electrical assembly comprising a circuitized substrate including a first dielectric layer, a first electrical conductor on the first layer, a quantity of material on this first electrical conductor, the quantity of material including a polymer resin and a quantity of nano-powders of ferroelectric ceramic material having a particle size substantially in the range of between about 0.01 microns and about 0.90 microns and a surface area for selected ones of said particles within the range of from about 2.0 to about 20 square meters per gram, a second electrical conductor positioned substantially on the quantity of material on the first electrical conductor, and a second dielectric layer, the second dielectric layer located adjacent the first dielectric layer and substantially over the second electrical conductor. The first electrical conductor, the quantity of material and the second electrical conductor form the internal capacitor. The assembly further includes at least one electrical component positioned on and electrically coupled to the circuitized substrate.

According to yet a further aspect of the invention, there is provided an information handling system comprising a housing, a circuitized substrate positioned substantially within the housing and including a first dielectric layer, a first electrical conductor on the first layer, a quantity of material on the first electrical conductor, this quantity of material including a polymer resin and a quantity of nano-powders of ferroelectric ceramic material having a particle size substantially in the range of between about 0.01 microns and about 0.90 microns and a surface area for selected ones of said particles within the range of from about 2.0 to about 20 square meters per gram, a second electrical conductor positioned substantially on the quantity of material on the first electrical conductor, and a second dielectric layer located adjacent the first dielectric layer and substantially over the second electrical conductor. The first electrical conductor, quantity of material and second electrical conductor form the substrate's internal capacitor. The system further includes at least one electrical component positioned on and electrically coupled to the circuitized substrate.

BEST MODE OF CARRYING OUT THE INVENTION

For a better understanding of the present invention, together with other and further objects, advantages and capabilities thereof, reference is made to the following disclosure and appended claims in connection with the above-described drawings. Like figure numbers may be used from FIG. to FIG. to identify like elements in these drawings.

By the term "circuitized substrate" as used herein is meant to include substrates having at least two (and preferably more) dielectric layers and at least three (and preferably more) metallurgical conductive layer(s). Examples include structures made of dielectric materials such as fiberglass-reinforced epoxy resins (some referred to as "FR-4" dielectric materials in the art), polytetrafluoroethylene (Teflon), polyimides, polyamides, cyanate resins, photo-imageable materials, and other like materials wherein the conductive layers are each a metal layer (e.g., power, signal and/or ground) comprised of suitable metallurgical materials such as copper, but may include or comprise additional metals (e.g., nickel, aluminum, etc.) or alloys thereof. Further examples will be described in greater detail herein-below. If the dielectric materials for the structure are of a photo-imageable material, it is photo-imaged or photo-patterned, and developed to reveal the desired circuit pattern, including the desired opening(s) as defined herein, if required. The dielectric material may be curtain-coated or screen-applied, or it may be supplied as dry film. Final cure of the photo-imageable material provides a toughened base of dielectric on which the desired electrical circuitry is formed. An example of a particularly useful photo-imageable dielectric is ASMDF (Advanced Soldermask Dry Film). This composition, which is further described in U.S. Pat. No. 5,026,624, which issued Jun. 25, 1991, and U.S. Pat. No. 5,300,402, which issued Apr. 25, 1994, includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photo-imageable dielectric composition. The dielectric layers taught herein may be typically about 2 mils to about 4 mils thick, but also thicker or thinner if desired. Examples of circuitized substrates include printed circuit boards (or cards) and chip carriers when the aforementioned fiberglass-reinforced epoxy resins, polytetrafluoroethylene (Teflon), polyimides, polyamides, cyanate resins and photo-imageable materials are used as the dielectric material. It is believed that the teachings of the instant invention are also applicable to what are known as "flex" circuits (which use dielectric materials such as polyimide) and those which use ceramic or other non-polymer type dielectric layers, one example of the latter being what are referred to as multi-layered ceramic (MLC) modules adapted for having one or more semiconductor chips mounted thereon.

By the term "ferroelectric ceramic" as used herein is meant ceramics that possess ferroelectric properties. These include barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof.

By the term "electrical component" as used herein is meant components such as semiconductor chips and the like which are adapted for being positioned on the external conductive surfaces of such substrates and electrically coupled to the substrate for passing signals from the component into the substrate whereupon such signals may be passed on to other components, including those mounted also on the substrate, as well as other components such as those of a larger electrical system which the substrate forms part of.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional printed circuit board (PCB) typically having several external components such modules (including one or more chip carriers), semiconductor chips, etc. mounted thereon and coupled to the internal circuitry of the PCB.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB can be referred to as a "motherboard" while various other boards (or cards) may be mounted thereon using suitable electrical connectors.

By the term "thru-hole" as used herein is meant to include what are also commonly referred to in the industry as "blind vias" which are openings typically from one surface of a substrate to a predetermined distance therein, "internal vias" which are vias or openings located internally of the substrate and are typically formed within one or more internal layers prior to lamination thereof to other layers to form the ultimate structure, and "plated through holes" (also known as PTHS), which typically extend through the entire thickness of a substrate. All of these various openings form electrical paths through the substrate and often include one or more conductive layers, e.g., plated copper, thereon. These openings are formed typically using mechanical drilling or laser ablation.

Figure 1:
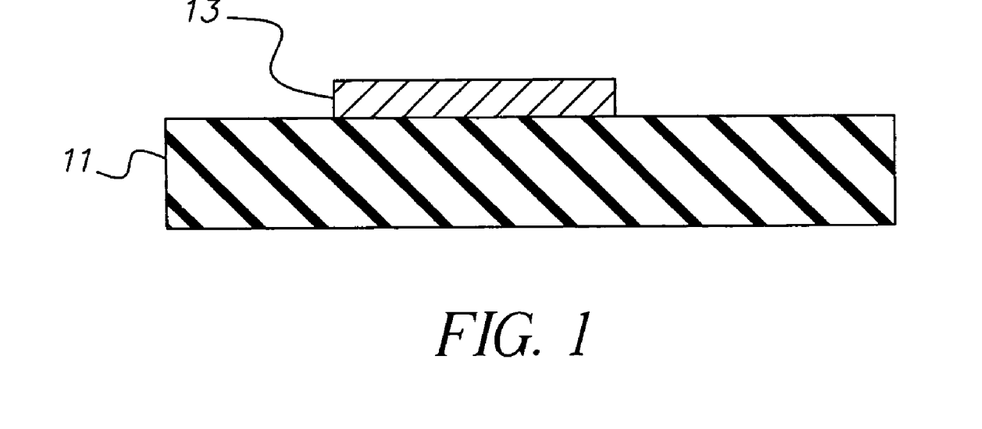
FIGS. 1-5 illustrate the steps of making a circuitized substrate according to one aspect of the invention.

In FIG. 1, a layer 11 of dielectric material is provided, this material selected from one of the above listed. Atop this layer is at least one electrical conductor 13, preferably of copper or copper alloy. In one embodiment, conductor 13 is formed from a larger sheet of material bonded to layer 11 and then subjected to known photolithographic processing used in the PCB industry, to finally define the conductor's configuration. In this embodiment, layer 11 may possess a thickness of from about one mil to about twenty mils (a mil being one-thousandths of an inch) while conductor 13 includes a thickness of from about 0.2 mils to about 2.5 mils. It is also within the scope of the invention to form conductor 13 using sputtering or other processes known in the PCB art. In a preferred embodiment, additional conductor elements (not shown) such as signal lines and/or pads are also formed simultaneously with conductor 13. As formed, these additional conductor elements are located adjacent conductor 13 on the upper surface of layer 11. These elements and conductor 13 form what can be referred to as the first layer of circuitry for the invention. This first electrical conductor 13 can now be also referred to as the first electrode for the invention's capacitor. If additional capacitors are desired, it is understood additional conductors 13 may also be formed, spaced from conductor 13 on layer 11. The invention is not limited to use of only one capacitor if more are desired.

The next step, optional but preferred, involves treating formed conductor 13 to enhance the adhesion of the surface thereof, for the purpose of providing increased adhesion for the subsequently deposited dielectric. To accomplish this, it is preferred to subject the exposed, upper surface to an oxide (or oxidation) alternative process. One good example of such a process involves exposing the conductor to what is referred to as a "BondFilm" solution currently available on the marketplace under this name from Atotech Deutschland GmbH, an international company having a U.S.A. business address at 1750 Overview Drive, Rock Hill, S.C. BondFilm solution is comprised primarily of three components: (1) sulfuric acid; (2) hydrogen peroxide; and (3) copper, as well as additional Atotech Deutschland GmbH proprietary constituents. As stated, this process is also referred to as an oxide alternative process, meaning that it does not result in the formation of oxide layers on the treated material. By way of example, the RMS roughness (a standard measurement means) value for the upper surface of conductor 13 after subjecting this surface to exposure to the "BondFilm" solution is about 0.6 microns with a peak of about 1.2 to about 2.2 microns. The BondFilm "process" involves immersing the conductor in the "BondFilm" solution for a period of from about 5 to about 120 seconds at a solution temperature of about 20 to 35 degrees Celsius (C.). As part of this treatment, the external surfaces of the conductor are initially cleaned and degreased, following which a micro-etch of the surfaces of both sides occurs. Finally, a thin organic coating is applied. In one example, this thin organic coating is benzotriazole and possesses a thickness of from about 50 Angstroms to about 500 Angstroms. This thin coating remains on the external surfaces of the conductor during subsequent processing. Because the coating is so thin, it cannot be adequately represented in the drawings and is not, therefore, shown. Other examples of alternative oxide processes which can be utilized with the invention are known in the industry and further description is not deemed necessary.

Figure 2:
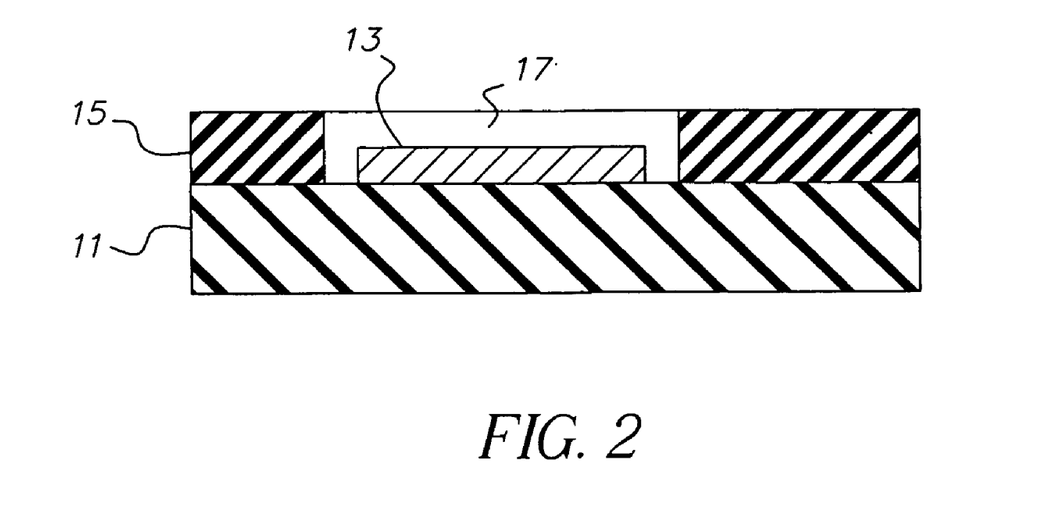

In FIG. 2, a layer 15 of photo-imageable (also dielectric) material is positioned on dielectric layer 11 to initially substantially cover conductor 13. Layer 15 is preferably applied using a lamination step and, in one embodiment, is from about one mil to about four mils thick, thereby slightly thicker than conductor 13. The preferred photo-imageable material applied here is the above ASMDF (Advanced Soldermask Dry Film) material which includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethylviolet dye; 0.03% FC 430, a fluorinated polyether nonionic surfactant from 3M Company; and 3.85% Aerosil 380, an amorphous silicon dioxide from Degussa to provide the solid content. Preferably, the ASMDF layer is left in an uncured or "B-staged" state, and is not fully cured (or hardened). Alternatively, it is possible to fully cure layer 15. This photo-imageable material, after initial application, is then selectively exposed whereupon an opening 17 is formed above and around conductor 13, as shown, to fully expose the top and side surfaces of conductor 13. Application of the photo-imageable dielectric material at this point, as described above, is preferred. However, it is also possible to apply this material and process same in a subsequent step (e.g. after deposition of the invention's capacitor dielectric material, as defined below).

Figure 3:
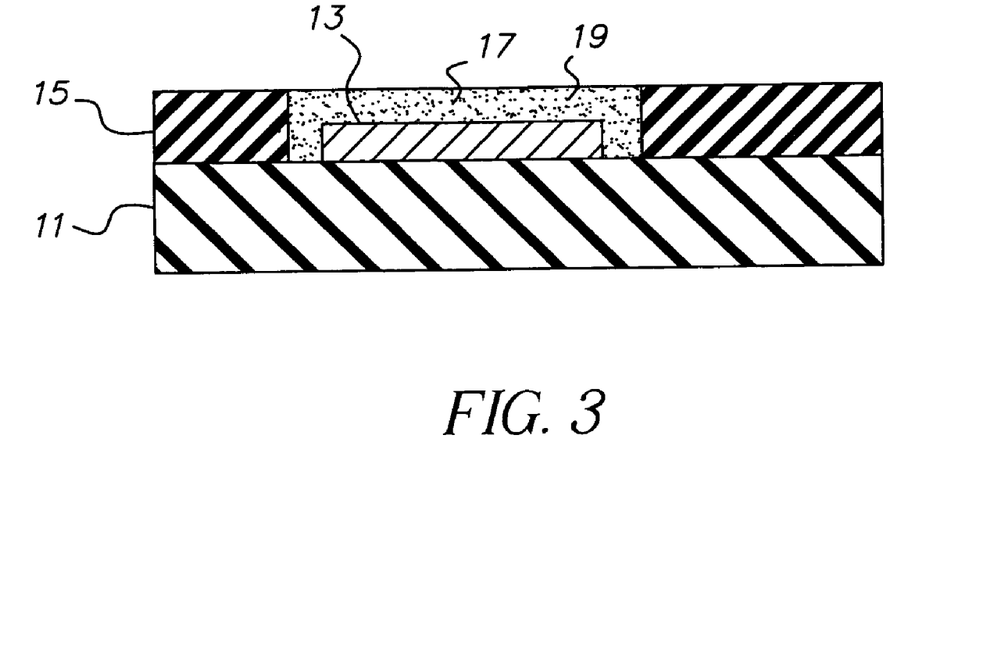
Figure 4:
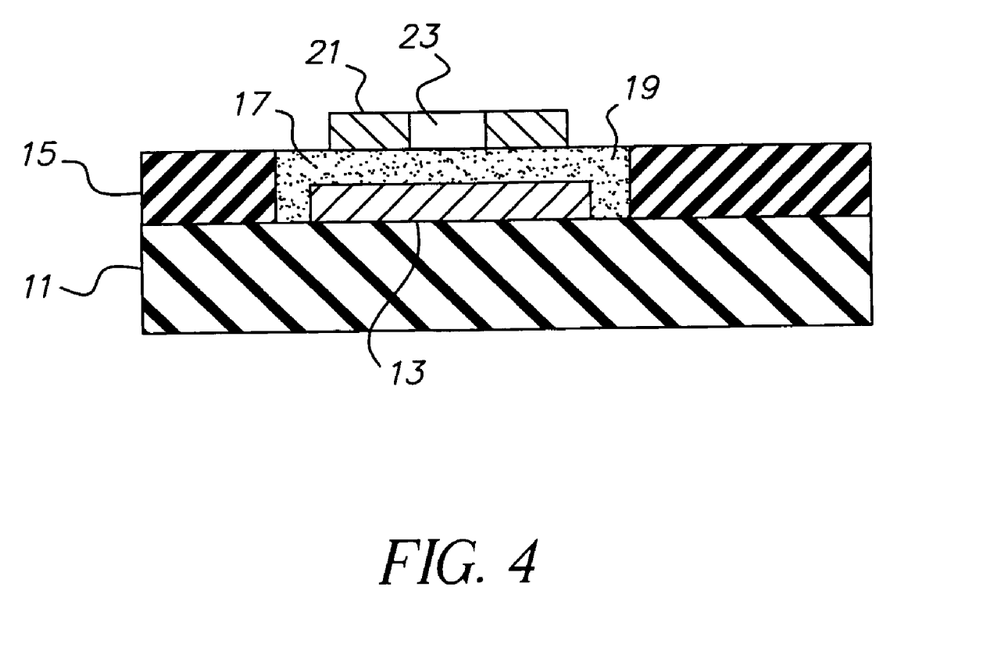

In FIG. 3, a quantity 19 of capacitor dielectric material is deposited within opening 17, preferably using screen or stencil printing. Examples of this material are defined in detail below. Briefly, this material comprises a polymer resin (e.g., a cycloaliphatic epoxy resin) and a quantity of nano-powders of ferroelectric ceramic material (e.g., barium titanate) having a particle size substantially in the range of between about 0.01 microns and about 0.90 microns and a surface area for selected ones of the particles within the range of from about two to about twenty square meters per gram. Significantly, the nano-powders used are not fired, and, equally significant, are of a size and surface area so as to enable effective formation of conductive thru-holes of the type defined above within the resulting substrate in which such thru-holes may be of extremely small diameter (in one example, as small as one to two mils) to thereby assure miniaturized, high density circuit patterns. As indicated, such miniaturization is deemed extremely important with respect to the designs of many present day circuitized substrates. In accomplishing printing of this capacitor dielectric material, a screen or stencil (not shown) is positioned over layer 15 and the dielectric material (described in greater detail below) is forced there-though, e.g., using a squeegee or blade. Quantity 19 substantially fills opening 17 and thus covers conductor 13. Quantity 19, as so deposited, is understandably in paste-like form, as also described in greater detail below. However, it is also possible to apply quantity 19 as a liquid, dispensing it through a suitable nozzle (not shown) to fill opening 17. Following dispense, quantity 19 is now "B-staged" to raise it to a more hardened state than as so dispensed. This hardening step is desired to enable the capacitor dielectric material to better serve as a foundation for the second electrical conductor 21, which is positioned thereon, as shown in FIG. 4.

Conductor 21 serves as the second electrode for the internal capacitor being formed in accordance with the teachings herein. In a preferred embodiment, conductor 21 is also copper or copper alloy, and is initially positioned on layer 15 (and quantity 19) in the form of a single copper foil. This foil is laminated to bond it in place, following which it is subjected to standard photolithographic processing which results in the final desired configuration, such as that shown in FIG. 4. Understandably, other conductor elements such as signal lines, pads, etc. may also be simultaneously formed on layer 15 or within suitable added openings formed therein. Thus, conductor 21 may form part of a larger circuit pattern at this location within the substrate. In a preferred embodiment, second conductor 21 may possess a thickness of from about 0.2 mils to about 1.5 mils. The preferred configuration is cylindrical, such that the conductor is viewed as being substantially round when viewed from the top. Further, an opening 23 is also preferably formed within the conductor, for reasons explained below. Although the preferred configuration has been defined as cylindrical with an opening within the conductor, it is understood that both the top and bottom electrodes may take any shape and size configuration to achieve the desired capacitance value as determined from the formula defined previously. Lamination is the preferred means for applying the foil which will eventually result in conductor 21 (and others, if desired) because the heat associated with this process serves also to fully cure both the ASDMF material for layer 15 as well as the capacitor dielectric material 19. Alternatively, it is possible to form second conductor 21 using a known sputtering operation in which the metal, preferably copper, is sputter deposited atop quantity 19. Still another formation procedure for conductor 21 is to sputter deposit a seed layer and then electroplate the copper there-over. Yet another procedure which can be used is to form a seed layer on quantity 19, then use both electroless and electroplating operations to form the final conductor thickness and shape. Various forms of such procedures are known in the art and further description is not considered necessary.

Figure 5:
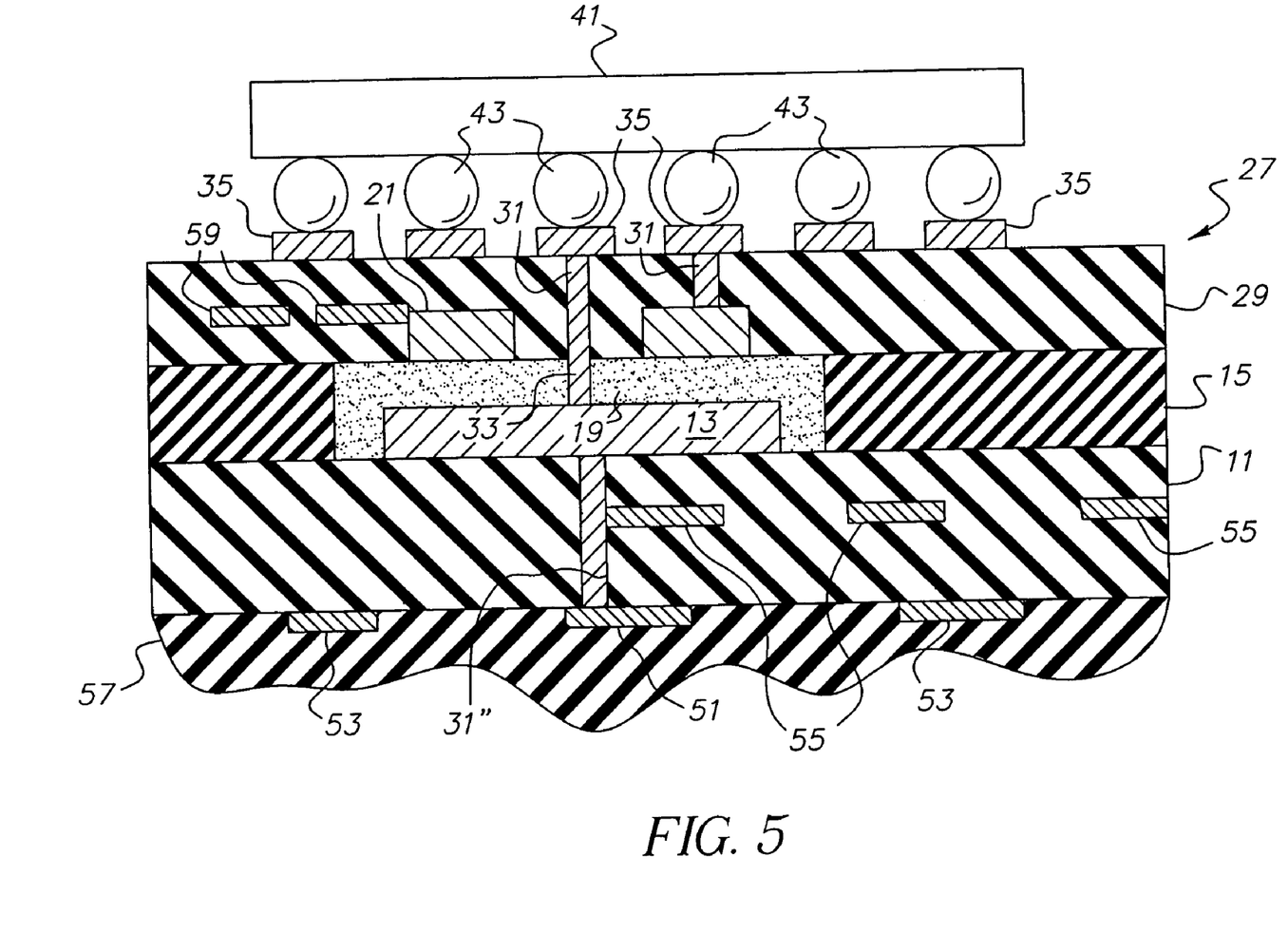

In FIG. 5, there is shown an example of a circuitized substrate 27 formed using the teachings herein. Most significantly, substrate 27 represents one example of how the internal capacitor formed above is now electrically coupled to other elements of the substrate so as to function therein as desired. In FIG. 5, a second dielectric layer 29 is added over layer 15, preferably using a lamination procedure known in the art. A preferred material for layer 29 is one of those mentioned above. An elongated opening 31 is then formed, e.g., using a mechanical drill or laser ablation, within layer 29 and, significantly, through the covering portion of quantity 19. Opening 31 is then preferably plated with metal 33, e.g., copper, to form a thru-hole within the substrate which extends from the substrate's upper surface to the now exposed upper surface of the lower or first conductor 13. A series of conductor pads 35 are also formed on this upper surface, preferably utilizing conventional photolithographic processing known in the PCB industry. The formed conductive thru-hole is thus electrically coupled to both one of these formed pads and conductor 13, to provide a current path there-between. Should a capacitive coupling be desired between two of the upper conductor pads 35, a second plated opening 31' can be formed within dielectric layer 29 and coupled to second electrode 21. This unique circuit arrangement allows an internal capacitor to form part of the circuit pattern including both pads 35, and thus between two or more conductive sites or pads of an electrical component 41 positioned on and electrically coupled (i.e., using a plurality of solder balls connections 43) to substrate 27. Component 41 in this particular example may be either a chip carrier, a semiconductor chip alone, or yet another electrical device.

In an alternative embodiment of FIG. 5, yet another opening 31" can be formed, this time within layer 11, and plated with copper or other suitable metal, as shown. Opening 31" is directly electrically coupled to the undersurface of first conductor 13 and to another conductor 51 which may in turn form part of a circuit pattern on the undersurface of layer 11. Such a pattern may include added elements such as pads or signal lines 53. It is also within the scope of the invention to provide yet another layer of circuitry within layer 11, e.g., using two dielectric sub-layers which are laminated after formation of the pattern. In this arrangement, the conductive thru-hole formed within opening 31" may also be electrically coupled to one or more of the internal conductors 55, e.g., pads or signal lines, which form part of this additional circuit pattern. Yet another dielectric layer 57 may be added, as well as additional conductive layers of signal pads or lines or other conductive elements, as desired. In all, as many as ten and even more additional conductive and dielectric layers are possible to form the final circuitized substrate as taught herein, depending on the operational requirements for this structure. Still further, it is understood that additional dielectric and conductive layers can be added to the opposite side of the substrate than as shown. That is, such layers can be added atop the pattern of conductors 35 if desired. As yet another alternative possibility, second conductor 21 may be coupled to one or more conductive elements 59 which form part of yet another conductive layer, this one within layer 29. If so, two dielectric sub-layers may be used to form final layer 29, with such a circuit pattern having conductors 59 as part thereof, formed on one of these sub-layers prior to bonding, e.g, using conventional lamination processing, to the other sub-layer.

It is thus understood with respect to FIG. 5 that many separate capacitive couplings are possible with various conductive elements which form part of or are located on the circuitized substrate. The internal or embedded capacitor formed within the substrate is uniquely able to provide such capacitance in a variety of circuit combinations, or, simply, within only one such circuit. It is further understood that the examples described and shown herein are not meant to limit the invention, as many additional possibilities exist and are well within the scope of one skilled in the art.

Figure 6:
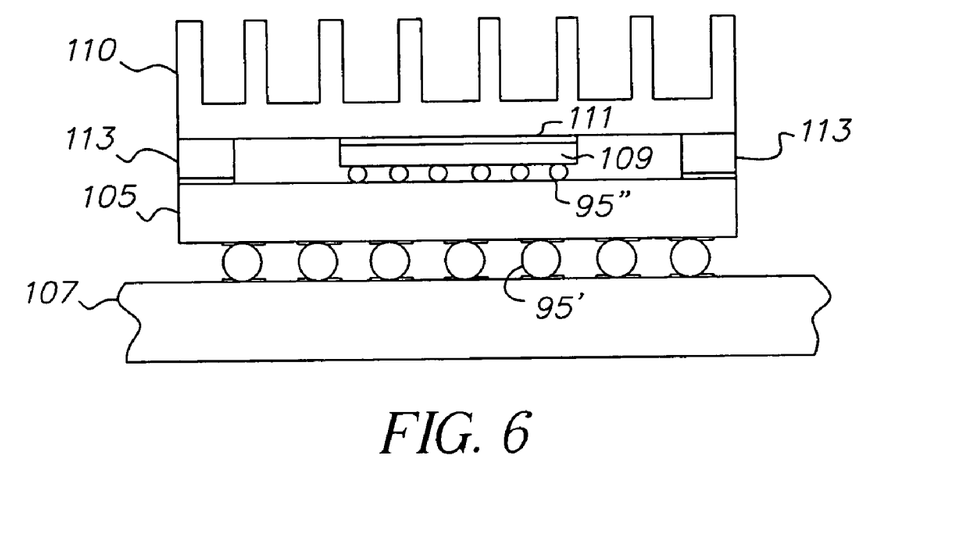
FIG. 6 is a side elevational view illustrating one example of a circuitized substrate (a PCB) of the invention and an example of an electrical assembly (a circuitized substrate in the form of a chip carrier having a semiconductor chip mounted thereon) adapted for being positioned on and electrically connected to the substrate.

FIG. 6 represents examples of the structures defined herein-above, the structure referenced by the numeral 105 being a chip carrier, while the structure represented by the numeral 107 is a PCB. Each is capable of including one or more internal capacitors of the type defined above as part thereof. Both such PCB and chip carrier assemblies are produced and sold by the Assignee of this invention. In the embodiment (assembly) of FIG. 6, the chip carrier 105 is mounted on and electrically coupled to PCB 107 using a plurality of solder balls 95' (preferably of conventional tin-lead composition as are solder ball connections 43 in FIG. 5), the chip carrier 105 in turn having a semiconductor chip 109 positioned thereon and electrically coupled to the carrier using the second plurality of solder balls 95" (also preferably of conventional tin-lead composition). The assembly in FIG. 6 may also include a heat sink 110 thermally coupled to the chip 109, e.g., using a conductive paste 111, and positioned on the upper surface of carrier 105 by appropriate standoffs 113, as is known in the art. It is also within the scope of those skilled in the art to utilize an encapsulating (also referred to as encapsulant in the industry), not shown, to substantially enclose (or encase) the chip and also to possibly eliminate the need for the heat sink if such an encapsulating material is used. Encapsulating material is also possible about the lower pluralities of solder balls 95'. It is even further within the scope of the invention to couple chip 109 using conventional wire-bonding in which a plurality of fine wires (not shown) are bonded between chip conductor sites and corresponding conductor pads on the underlying substrate.

Figure 7:
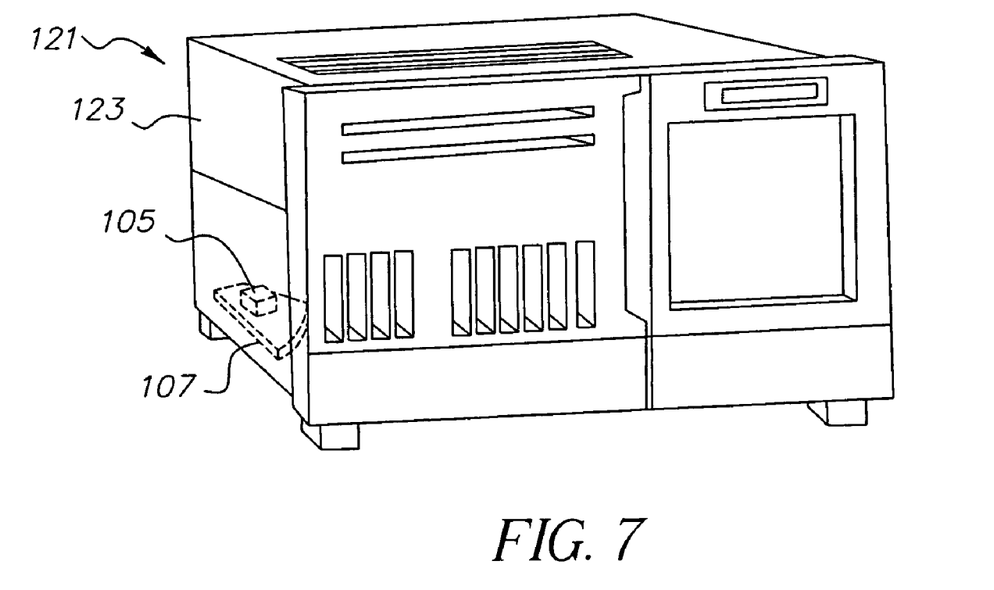
FIG. 7 is a perspective view of an information handling system adapted for using one or more of the circuitized substrates of the instant invention.

In FIG. 7, there is shown an information handling system 121 which is preferably a personal computer, a mainframe computer or a computer server. Other types of information handling systems known in the art of this type may also utilize the teachings of this invention. The circuitized substrate or substrates as formed in accordance with the teachings herein, each including one or more internal capacitors as taught above, may be utilized in the system 121 as a PCB 107 (shown hidden) and/or a chip carrier 105 (also shown hidden). The circuitized substrates may be utilized as a mother board in system 121 or as one or more individual PCBs typically utilized in such systems. As is known, systems 121 are usually contained within a suitable metal or insulative housing such as shown by the numeral 123, with appropriate venting (if desired) therein, as well as instrumentation externally accessible for system operation by the system's designated operator. The remaining elements of information handling systems of these types are known in the art and further description is not believed necessary.

The following four examples represent various combinations of capacitor dielectric materials and processes used to form capacitors according to various aspects of the invention. These are understood to be examples only and not limiting of the scope of this invention.

EXAMPLE ONE

Fifty grams (gm) of cycloaliphatic epoxy resin (e.g., one sold under product designation "ERL-4211" by the Union Carbide Corporation, Danbury, Conn.) was mixed with about 50 gm of hexahydro-4-methylphthalic anhydride and 0.4 gm N,N dimethyl benzylamine. The mixed solution was stirred for 10 minutes to assure uniform mixing. Sixty gm of barium titanate ($BaTiO_3$) powder available from the Nippon Chemical Industrial Co., Ltd., of Tokyo, Japan was added to 17.5 gm of the mixed solution and formed into a screen printable paste. A layer of this material was screened through a 145 mesh screen onto the top surface of a copper first electrical conductor. This layer was then cured at approximately 150° C. for about two hours. The second electrical conductor was then formed using a sputtering operation atop the cured screen printed material using a mask normally used for such sputtering operations. The resulting capacitance density of the formed capacitor measured about 5.5 nano-Farads(nF)/square inch, with a dielectric loss of only about 0.02 at 1 Mega-Hertz (MHz). The average (mean) particle size for the added powder was about 0.5 micron, the surface area about 2.65 square meters/gm, and the specific gravity about 5.30.

EXAMPLE TWO

As in Example One, fifty grams (gm) of "ERL-4211" cycloaliphatic epoxy resin was mixed with about 50 gm of hexahydro-4-methylphthalic anhydride and 0.4 gm N,N dimethyl benzylamine. The mixed solution was stirred for 10 minutes to assure uniform mixing. 150 gm of a combination of barium titanate, calcium titanate and zirconium powders (also available from the Nippon Chemical Industrial Co., Ltd. Tokyo, Japan) was mixed thoroughly with 100 gm of the mixed solution and formed into a screen printable paste. A layer of this material was screened through a 200 mesh screen onto the top surface of a copper first electrical conductor. This layer was then cured at approximately 150° C. for about two hours, as in Example One. The second electrical conductor was then formed using a sputtering operation atop the cured screen printed material using a mask normally used for such sputtering operations. The average (mean) particle size for the added powder was about 0.2 micron, the surface area about 8.25 square meters/gm, and the specific gravity about 5.15.

EXAMPLE THREE

As in Examples One and Two, fifty grams (gm) of "ERL-4211" cycloaliphatic epoxy resin was mixed with about 50 gm of hexahydro-4-methylphthalic anhydride and 0.4 gm N,N dimethyl benzylamine. The mixed solution was stirred for 10 minutes to assure uniform mixing. 150 gm of Nippon Chemical Industrial's barium titanate powder was mixed thoroughly with 100 gm of the mixed solution and made into a screen printable paste. A layer of this paste material was screened through a 200 mesh screen onto the top surface of a copper first electrical conductor. This layer was then cured at approximately 150° C. for about two hours, as in Example One. The second electrical conductor was then formed using a sputtering operation atop the cured screen printed material using a mask normally used for such sputtering operations. The average (mean) particle size for the added powder was about 0.1 micron, the surface area about 15.08 square meters/gm, and the specific gravity about 5.52.

EXAMPLE FOUR

Fifty grams (gm) of "ERL-4211" cycloaliphatic epoxy resin was mixed with about 50 gm of hexahydro-4-methylphthalic anhydride, 0.4 gm N,N dimethyl benzylamine and 20 gm of an epoxy novolac resin (e.g. one sold under product designation "LZ 8213", by Huntsman, Salt Lake City, Utah). The mixed solution was stirred for 30 minutes to assure uniform mixing.

120 gm of Nippon Chemical Industrial's barum titanate powder was added to 56 gm of the mixed solution and formed into a screen printable paste. A layer of this material was screened through a 200 mesh screen onto the top surface of a copper first electrical conductor. This layer was then cured at approximately 150° C. for about two hours, followed by an additional cure at approximately 190° C. for about one hour. The second electrical conductor was then formed using a sputtering operation followed by a copper electroplating process and a photolithographic etch step. The resulting capacitance density of the formed capacitor measured about 5.5 nano-Farads(nF)/square inch, with a dielectric loss of only about 0.02 at 1 mega-Hertz (mHz). The average (mean) particle size for the added powder was about 0.5 micron, the surface area about 2.65 square meters/gm, and the specific gravity about 5.30.

Thus there has been shown and described a circuitized substrate having one or more internal capacitors as part thereof, which substrate can be formed using many conventional PCB processes to thereby reduce costs associated with production thereof. There have also been defined several examples of capacitor dielectric material which can be sandwiched between two opposing conductors as part of such a unique internal capacitor structure. The invention as defined herein, if desired, is capable of transmitting both regular and high speed (frequency) signals, the latter at a rate of from about one Gigabits/sec to about ten Gigabits/second, while substantially preventing impedance disruption. It is also capable of being produced using many conventional PCB processes so as to assure reduced cost and facilitate ease of manufacture. That is, the preferred method for assembling the circuitized substrate of the invention preferably involves the use of conventional lamination processes as part of the method, in which the dielectric layers, having the designated circuitry and/or conductive elements (planes) thereon are "stacked up" in aligned manner with one another and subjected to relatively high pressures and temperatures associated with conventional lamination. Of perhaps greater significance, the invention is able to assure circuit pattern miniaturization as is deemed extremely important with regards to many of today's design requirements.

While there have been shown and described what at present are considered the preferred embodiments of the invention, it will be obvious to those skilled in the art that various changes and modifications may be made therein without departing from the scope of the invention as defined by the appended claims.

What is claimed is:

1. A method of making a circuitized substrate having a capacitor included therein, said method comprising:
    providing a first organic dielectric layer;
    forming a first electrical conductor on said first organic dielectric layer;
    positioning a second dielectric layer on said first organic dielectric layer and said first electrical conductor, said second dielectric layer being in an uncured state;
    forming an opening within said second dielectric layer to expose said first electrical conductor;

filling said opening within said second dielectric layer with a quantity of capacitive dielectric material in paste form, using a screen printing operation having a mesh screen and maintaining the openings of a fine mesh screen, said quantity of capacitive dielectric material being positioned on said first electrical conductor and including a hexahydro-4-methylphthalic anhydride polymer resin and a quantity of nano-powders of ferroelectric ceramic material having a particle size substantially in the range of from about 0.01 microns to about 0.90 microns and a surface area for selected ones of said particles within the range of from about 2.0 to about 20 square meters per gram; and positioning a second electrical conductor substantially on said quantity of capacitive dielectric material on said first electrical conductor, said positioning of said second electrical conductor substantially fully curing both said second dielectric layer and said quantity of capacitive dielectric material in said opening within said second dielectric layer, said first electrical conductor, said quantity of capacitive dielectric material and said second electrical conductor forming a capacitor within said circuitized substrate.

2. The method of claim 1 wherein said second dielectric layer comprises photo-imageable dielectric material, and said opening within said second dielectric layer is formed using an exposure procedure.

3. The method of claim 1 wherein said positioning of said second electrical conductor substantially on said quantity of capacitive dielectric material on said first electrical conductor is accomplished using a lamination procedure.

4. The method of claim 1 further including positioning a third dielectric layer on said second conductor and there-after forming a plurality of electrical conductors on said third dielectric layer and electrically coupling at least one of said plurality of electrical conductors to said second electrical conductor.

5. The method of claim 1 wherein said first electrical conductor is formed using photolithography processing.

6. The method of claim 1 wherein said positioning of said quantity of capacitive dielectric material on said first electrical conductor is accomplished using screen printing.

7. The method of claim 1 wherein said positioning of said quantity of capacitive dielectric material on said first electrical conductor is accomplished using stencil printing.

8. The method of claim 1 further including providing electrical circuitry within said circuitized substrate and electrically coupling said circuitry to said first electrical conductor.

9. The method of claim 8 wherein said electrical coupling of said circuitry to said first electrical conductor is accomplished utilizing at least one conductive thru-hole, said thru-hole extending though said capacitive dielectric material.

10. The method of claim 9 further including providing an opening within said second electrical conductor, said electrical coupling of said circuitry to said first electrical conductor utilizing at least one conductive thru-hole occurring through said opening within said second electrical conductor.

11. The method of claim 1 further including forming a thin organic coating on said first electrical conductor prior to said substantially filling said opening within said second dielectric layer with said quantity of capacitive dielectric material.

12. The method of claim 1 further including positioning at least one electrical component on said circuitized substrate and electrically coupling said capacitor within said circuitized substrate to said at least one electrical component to form an electrical assembly.

13. The method of claim 12 further including providing a housing and positioning said electrical assembly within said housing to form an information handling system.

14. A method of making a circuitized substrate having a capacitor included therein, said method comprising:

providing a first organic dielectric layer;

forming a first electrical conductor on said first organic dielectric layer;

positioning a second dielectric layer on said first organic dielectric layer and said first electrical conductor;

forming an opening within said second dielectric layer to expose said first electrical conductor;

filling said opening within said second dielectric layer with a quantity of capacitive dielectric material in paste form using a screen printing operation in which a mesh screen is utilized, said quantity of capacitive dielectric material being positioned on said first electrical conductor and including a hexahydro-4-methylphthalic anhydride polymer resin and a quantity of nano-powders of ferroelectric ceramic material having a particle size substantially in the range of from about 0.01 microns to about 0.90 microns and a surface area for selected ones of said particles within the range of from about 2.0 to about 20 square meters per gram;

hardening said quantity of capacitive dielectric material within said opening within said second dielectric layer, and thereafter positioning a second electrical conductor substantially on said quantity of capacitive dielectric material on said first electrical conductor, said quantity of capacitive dielectric material and said second electrical conductor forming a capacitor within said circuitized substrate.

15. The method of claim 14 wherein said mesh screen is 145 mesh.

16. The method of claim 14 wherein said mesh screen is 200 mesh.

* * * * *